United States Patent
Matsumura

[19]
[11] Patent Number: 5,823,736
[45] Date of Patent: Oct. 20, 1998

[54] SUBSTRATE PROCESSING DEVICE AND METHOD FOR SUBSTRATE FROM THE SUBSTRATE PROCESSING DEVICE

[75] Inventor: Yoshio Matsumura, Hikone, Japan

[73] Assignee: Dainippon Screen Mfg. Co., Ltd., Japan

[21] Appl. No.: 610,712

[22] Filed: Mar. 4, 1996

[30] Foreign Application Priority Data

Mar. 6, 1995 [JP] Japan .................................... 7-045421

[51] Int. Cl.⁶ .................................................. B25J 15/06
[52] U.S. Cl. ........................ 414/609; 414/222; 414/935; 414/217; 414/786; 269/909; 249/68
[58] Field of Search .................................. 414/416, 417, 414/403, 786, 749, 217, 222, 225, 627, 744.2, 744.3, 737, 751, 752, 935, 937, 939, 941, 609, 669; 269/21, 289 R, 909; 83/137; 249/67, 68; 199/92; 294/64.1, 65; 425/422, 444

[56] References Cited

U.S. PATENT DOCUMENTS

| | | | |
|---|---|---|---|
| 3,817,402 | 6/1974 | Van de Walker et al. | 414/618 |
| 4,591,044 | 5/1986 | Ogami et al. | 414/935 X |
| 4,776,745 | 10/1988 | Foley | 414/222 X |
| 5,197,089 | 3/1993 | Baker | 414/222 X |
| 5,345,639 | 9/1994 | Tanoue et al. | 15/88.2 |
| 5,374,147 | 12/1994 | Hiroki et al. | 414/217 |
| 5,445,491 | 8/1995 | Nakagawa et al. | 414/222 X |
| 5,540,535 | 7/1996 | Hamuro et al. | 414/417 |

FOREIGN PATENT DOCUMENTS

| | | | |
|---|---|---|---|
| 3909 | 1/1990 | Japan | 414/935 |
| 14237 | 1/1992 | Japan | 414/935 |
| 190414 | 7/1993 | Japan | 414/935 |

Primary Examiner—Frank E. Werner
Attorney, Agent, or Firm—Ostrolenk, Faber, Gerb & Soffen, LLP

[57] ABSTRACT

Main lifter pins and sub-lifter pins are arranged on the top surface of a plate to support a rectangular frame area of a glass substrate of a liquid crystal display. The rectangular frame area is an area surrounding a rectangular center area which is a surface area requiring processing. The main lifter pins and sub-lifter pins cooperate to push up the substrate from the top surface of the plate after a surface processing of the substrate on the plate is completed. The main lifter pins and the sub-lifter pins are arranged to contact a pair of shorter sides and a pair of longer sides of the rectangular frame area, respectively. The substrate is easily removed from the plate without being bent due to its own weight. Then, the main lifter pins further push up the substrate to a level at which the substrate is transferred to a transporter robot.

29 Claims, 9 Drawing Sheets

F I G . 7
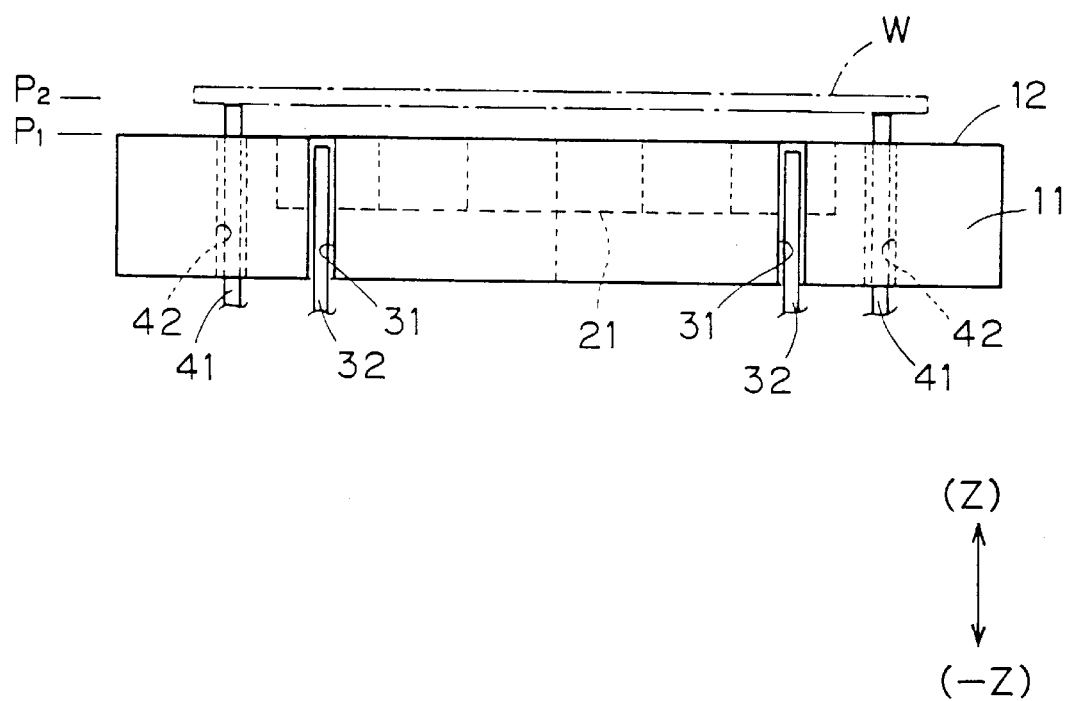

SUBSTRATE PROCESSING DEVICE AND METHOD FOR SUBSTRATE FROM THE SUBSTRATE PROCESSING DEVICE

BACKGROUND OF THE INVENTION

1. Field of the Invention

The present invention relates to a substrate processing device in which a substrate is heated, cooled, or by application of an adhesion layer the substrate is statically placed at a predetermined position, and also relates to a method for removing our the processed substrate from such substrate processing device. The substrate can be a rectangular glass substrate for manufacturing a liquid-crystal display, or it can be substrate for manufacturing a color-filter, a printed circuit board, a circular semiconductor wafer or the like.

2. Description of the Background Art

In the field of manufacturing liquid-crystal displays, semiconductors or the like, various types of substrate processing devices are well known in which a substrate, transported by a robot hand, is placed at a predetermined processing position and thereafter the placed substrate is heated, cooled, or applied by adhesion layer. The typical type of devices for supporting the substrate at the processing position includes a supporting plate, having an upper surface on which the substrate can be placed directly. Such device may include means for tightly contacting the substrate with the upper surface of the plate member by vacuum suction. The other type of the devices for supporting the substrate at the processing position includes a set of proximity pins, protruding from the upper surface of the supporting plate. In this device, the substrate is placed on the tops of the plurality of proximity pins and is supported at a slightly high position from the upper surface of the supporting plate.

In both types of devices, a transferring mechanism is necessary for transferring the substrate between said processing position and a transferring position of a robot hand provided for transporting the substrate from or to an other substrate processing device. More particularly, the transferring mechanism must be operable to receive the substrate transported by the robot hand at the transferring position and bring the received substrate into the processing position. After processing the surface of the substrate, the transferring mechanism must bring the processed substrate from the processing position to the transferring position for removal by the robot hand.

FIG. 1A illustrates a plane view of a conventional supporting plate 51 on which a rectangular glass substrate W for a liquid-display is placed. The plate 51 is provided with two pairs of lifter pins 53 which are projectable from the supporting surface of the plate 51. The major surface of the substrate W includes: a rectangular effective area EA which is the center area of the major surface to which electric display elements are to be formed; longitudinal-side regions $R_L$ defined along the longitudinal sides of the rectangular effective are a EA; and short-side regions $R_S$ defined along the short sides of the rectangular effective are a EA. The lifter pins 53 are located in the short-side regions $R_S$.

The substrate W is introduced by a robot hand AR, as illustrated in FIG. 1B, and is transferred to the pins 53 projected above the processing surface of the plate 51. Then, the hand AR retires from the transfer position and the pins 53 are moved down into the plate 51, whereby the substrate W is placed on plate 51 and the state of FIG. 1A is obtained. After the surface processing, the substrate W is taken out of the plate 51 through a reverse process. The locations of the pins 53 are determined such that the pins 53 do not interfere with the hand AR in the transfer step as shown in Fig. 1B.

Recent progress in liquid-crystal technology allows for an increase in the plane size and reduction in the thickness of glass substrates. Accordingly, the substrate W easily bends by its own weight when it is supported by the lifter pins 53. When the bend in the substrate W is large, the substrate W is hardly separated from the plate 51 and is hardly lifted tip to the transfer level by the pins 53 provided only in the short-side regions $R_s$.

Further, the substrate processing device is located in a clean room in which clean air is always flowing downwardly. The downward flow of air pushes down on the substrate W, which enhances the difficulty in lifting the substrate W by the pins 53.

Particularly, in the substrate processing device in which the substrate W is tightly contacted with the upper surface of the supporting plate by vacuum suction, the vacuum suction force is not removed perfectly even if the source of the vacuum suction is turned off. Therefore, since the lifter pins 53 must lift up the substrate W contrary to the residual vacuum suction force in such device, the difficulty in lifting up the substrate W by the lifter pins 53 is enhanced.

SUMMARY OF THE INVENTION

The present invention relates to a device for processing a substrate. According to the present invention, the device comprises: a) means for holding the substrate at a first level; b) means for processing the substrate held by the holding means at the first level; c) first pushing means for pushing up the substrate from the first level to a second level defined above the first level; and d) second pushing means for pushing up the substrate from the second level to a third level defined above the second level to locate the substrate at a position on which the substrate is capable of being removed.

In the preferred embodiment of the present invention, the first pushing means pushes up a lower surface of the substrate at a predetermined first portion, while the second pushing means pushes up the lower surface of the substrate at a predetermined second portion different from the first portion.

In an aspect of the present invention, the first pushing means has a plurality of pins integrally projectable from the first level, and the second pushing means also has a plurality of pins integrally projectable from the second level.

Preferably, the projecting length of the plurality of pins of the first pushing means above the first level is smaller than the projecting length of the plurality of pins of the second pushing means above the first level.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 illustrates another example of the operations of the embodiment of FIG. 3.

DESCRIPTION OF THE PREFERRED EMBODIMENTS

Outline of the Substrate Processing Device

Figure 1A:
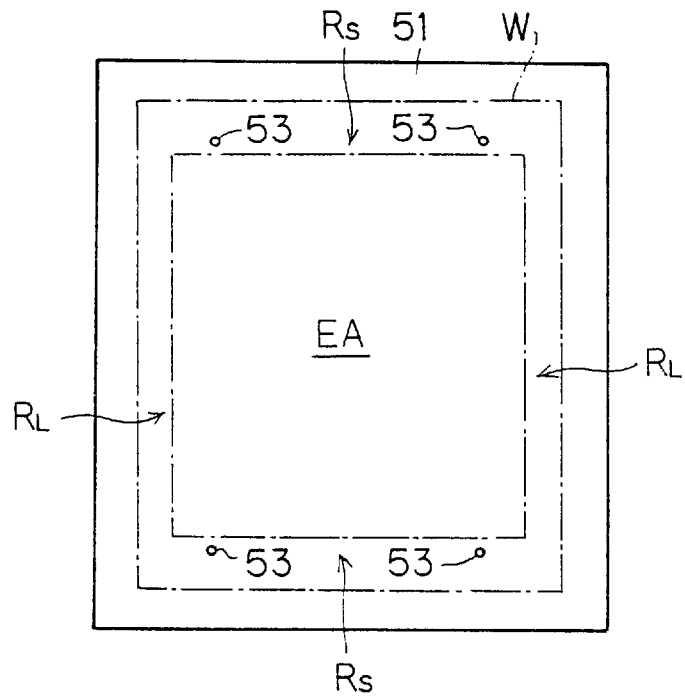
FIGS. 1A and 1B illustrate plane views of a conventional supporting plate.
Figure 1B:
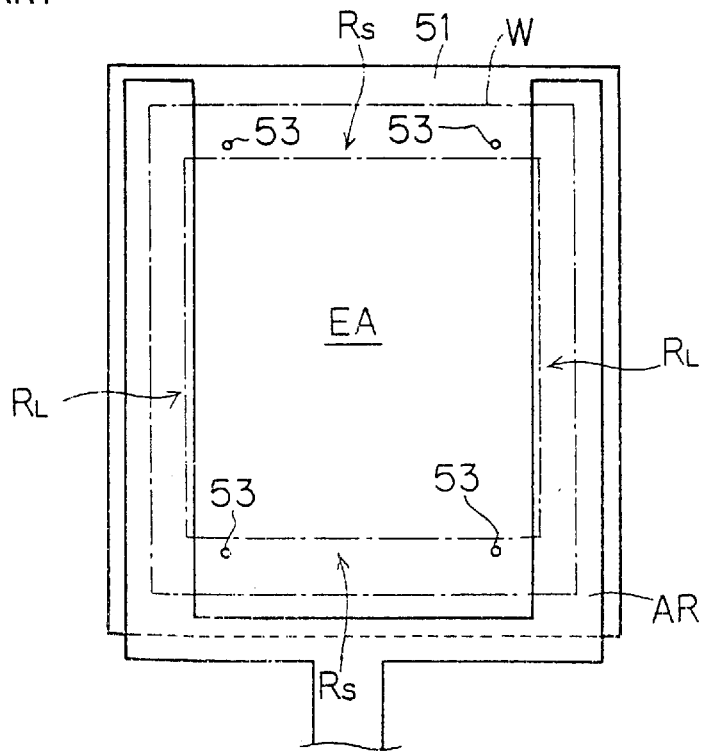
Figure 2:
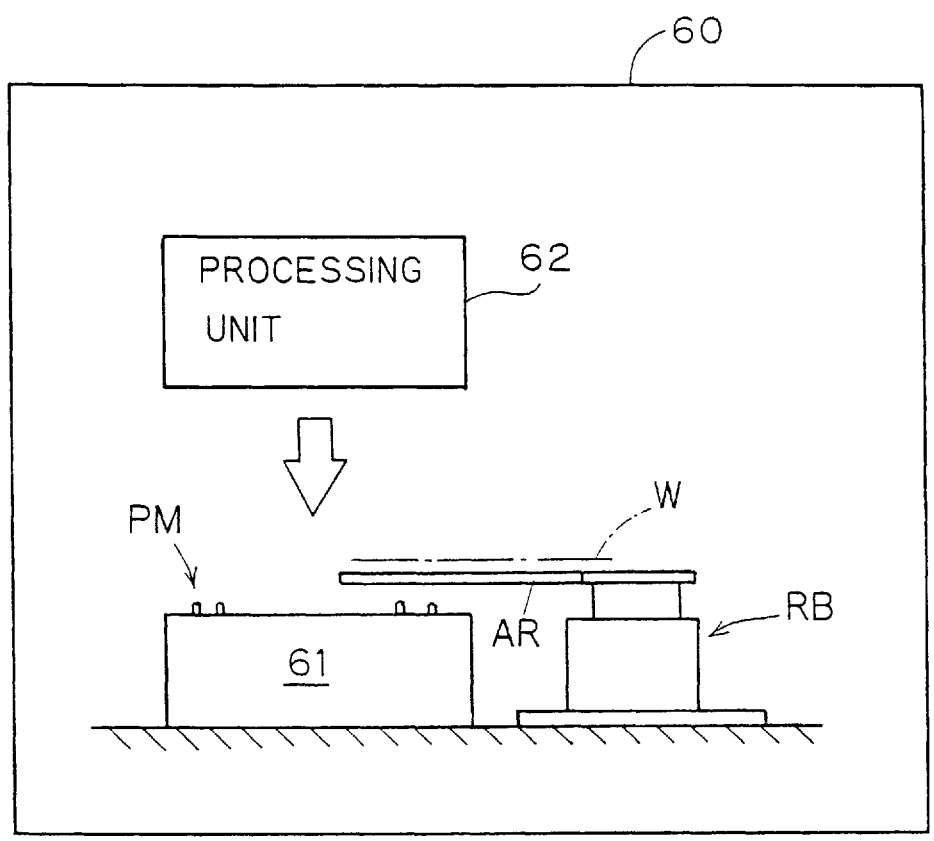
FIG. 2 is a conceptional side view of a device for processing a substrate according to a preferred embodiment of the present invention.

FIG. 2 is a conceptional side view of a device 60 for processing a substrate according to a preferred embodiment of the present invention. The device 60 is constructed to process a major surface of a rectangular glass substrate W for a liquid-crystal display. A movable transporter robot RB having a robot hand AR is provided to transport the substrate W between a supporting device 61 and the exterior of the device 60. The substrate W is transferred onto the supporting device 61 by robot hand AR and a pin mechanism PM included in the supporting device 61, which will be described later. The processing unit 62 performs a predetermined process to the substrate W. The processed substrate W is lifted up by the pin mechanism PM and is transferred to the hand AR. Then, the substrate W is delivered to the exterior of the device 60.

Supporting Device 60 and Pin Mechanism PM

Figure 3:
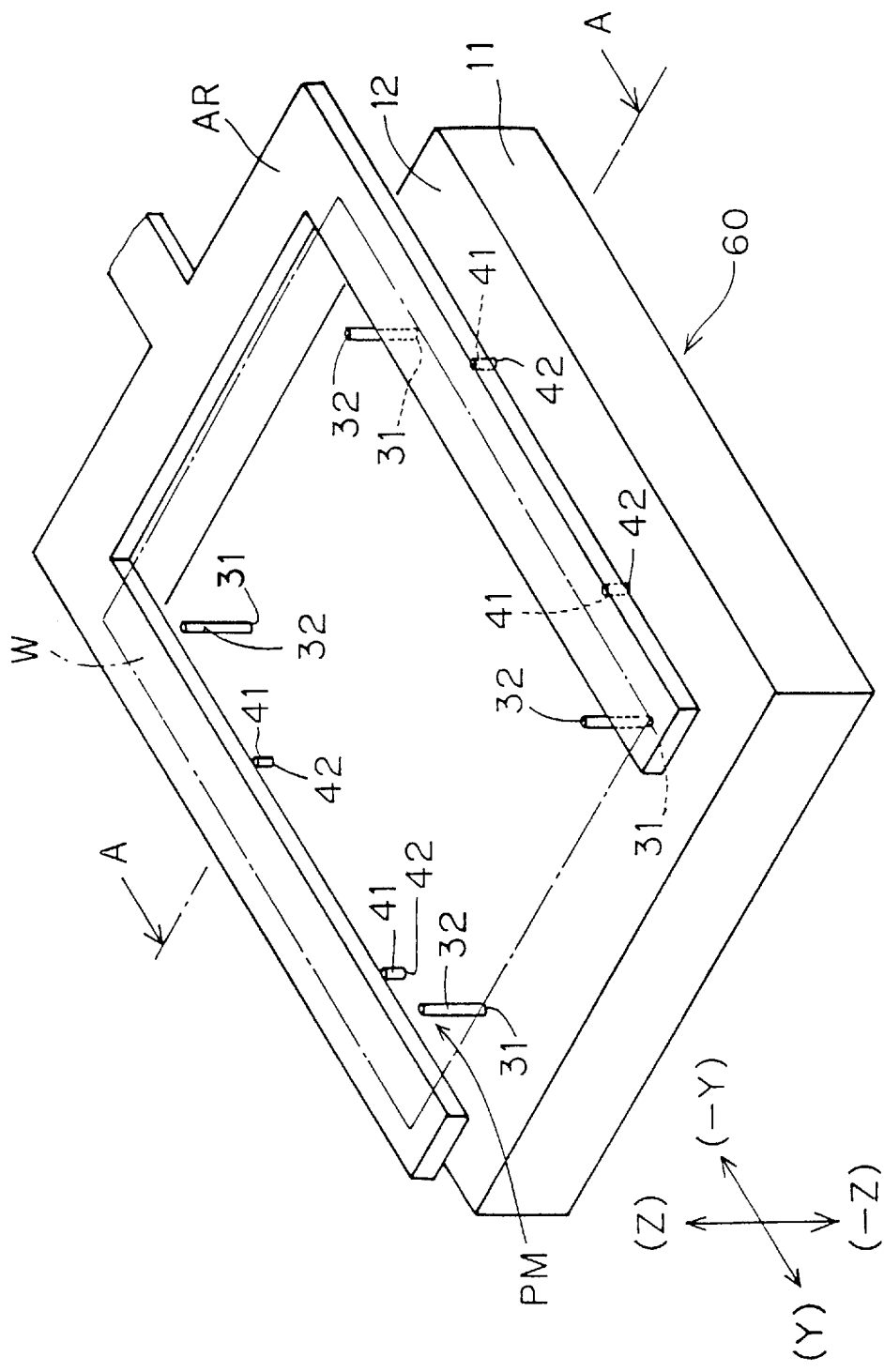
FIG. 3 is a perspective view of a supporting device of a substrate according to the preferred embodiment of the present invention.
Figure 4:
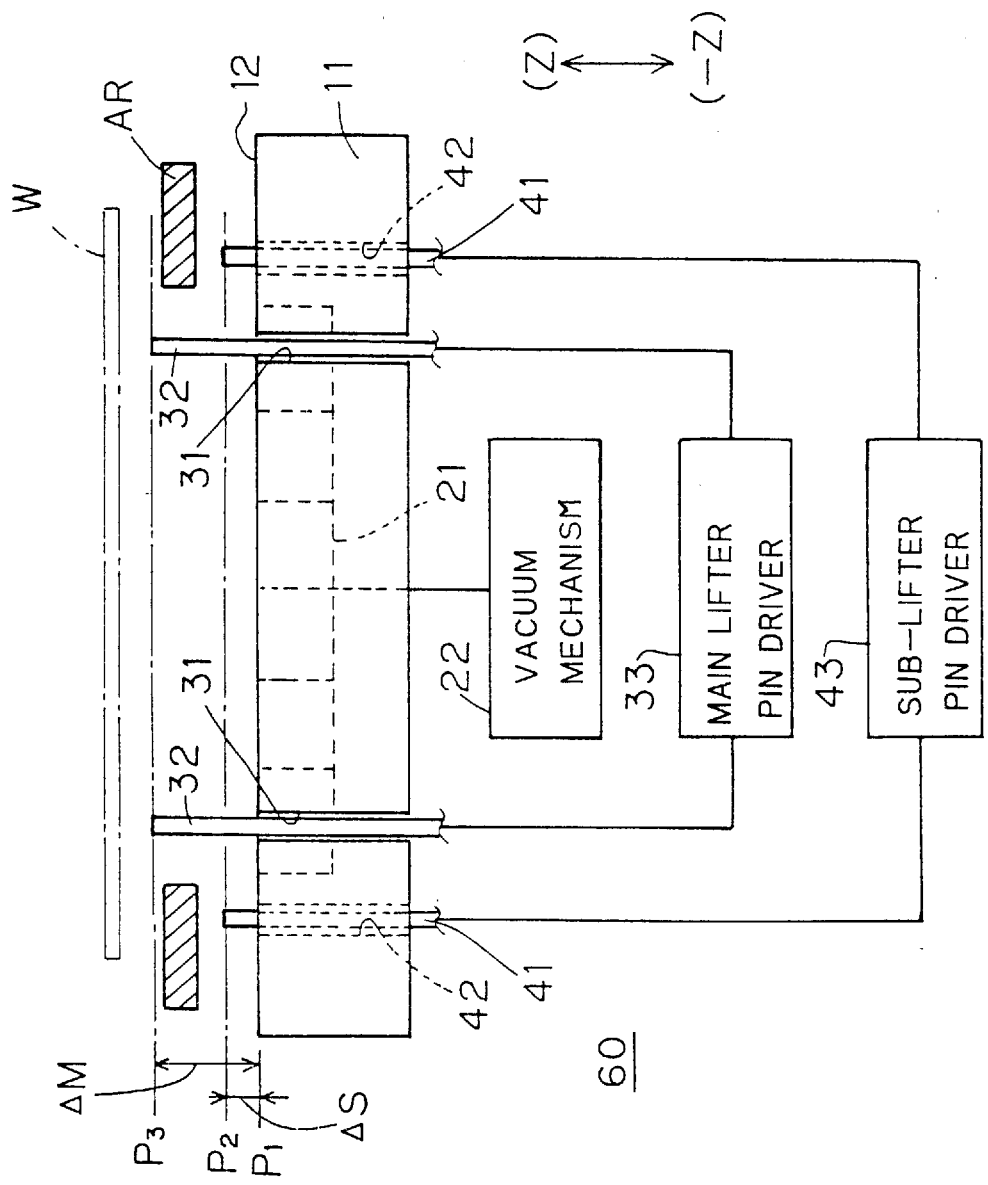
FIG. 4 is a cross sectional view along the line A—A in FIG. 3.
Figure 5:
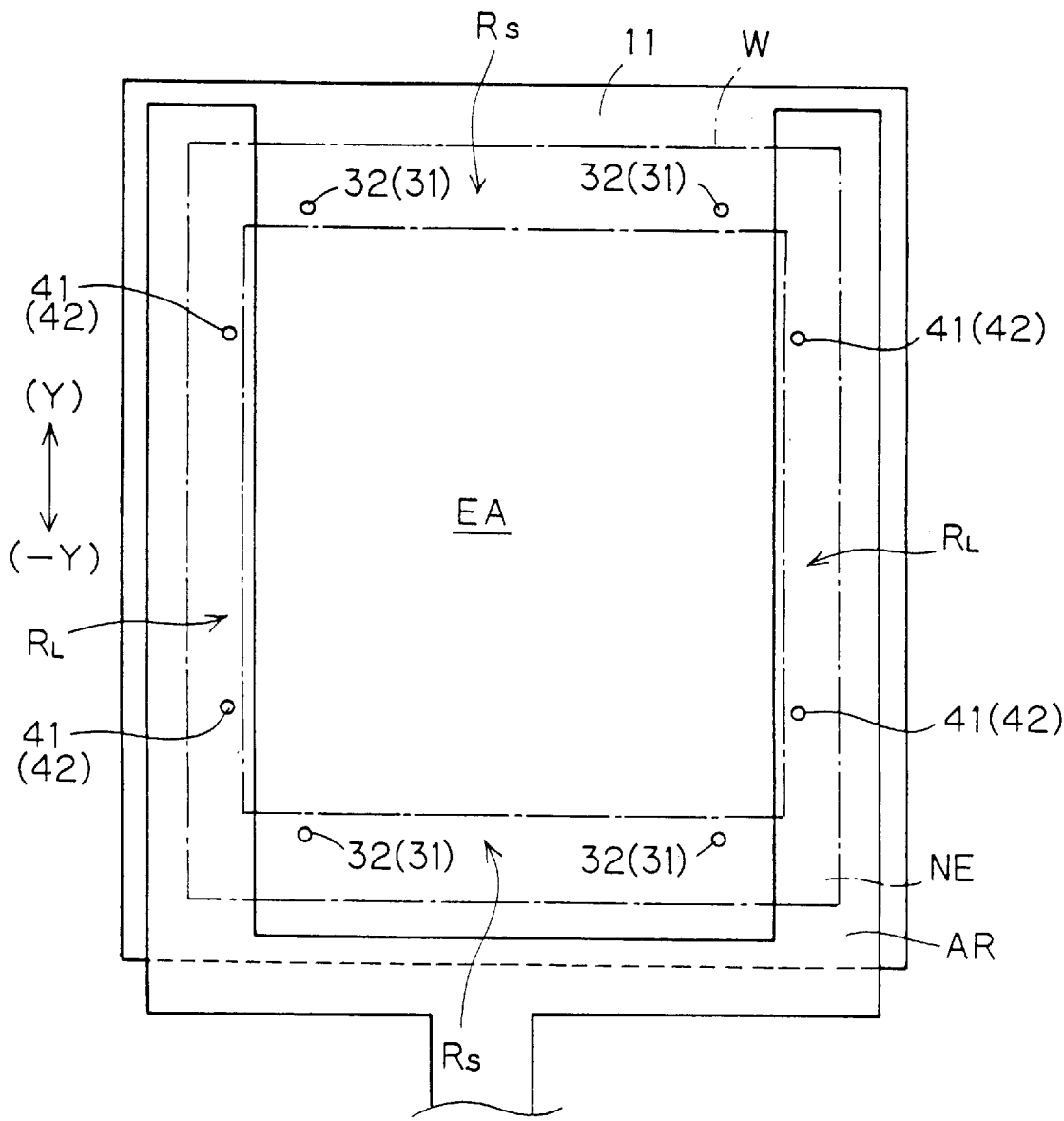
FIG. 5 is a plane view of the supporting plate of FIG. 3.

FIG. 3 is a perspective view of the supporting device 60, FIG. 4 is a sectional view along a line A—A of FIG. 3, and FIG. 5 is a plane view of the supporting device 60. The supporting device 60 comprises a supporting plate 11 having a upper surface 12 on which the substrate W can be placed. The substrate W is processed at the level $P_1$, (FIG. 4) of the upper surface 12, and therefore, the level $P_1$ known as "a process level" of the substrate W. The plate 11 serves as holding means for holding the substrate W at the process level $P_1$ in the supporting device 60.

A plurality of vacuum suction holes (not shown) are formed on the upper surface 12 of the plate 11. A vacuum mechanism 22 (FIG. 4) is operable to propagate negative pressure to the plurality of vacuum suction holes through tunnels 21 formed in the plate 11, whereby the substrate W can be tightly held on the tipper surface 12 of the plate 11.

Four through holes 31 are formed in the plate 11 along the vertical direction Z, and four main lifter pins 32 are inserted into the through holes 31, respectively. The main lifter pins 32 are movable in the vertical direction 7 so that the top portions thereof can project to the space above the upper surface 12 of the plate 11. As illustrated in FIG. 5, the main lifter pins 32 are arranged in the longitudinal-side regions or strips $R_L$ of a non-effective area NE of the substrate W to be supported. The non-effective area NE is a frame area surrounding an effective area EA which is the center area of the major surface of the substrate W. Electric display elements and patterns are to be formed within the effective area EA. The main lifter pins 32 are connected to a main lifter pin driver 33 (FIG. 4). When the main lifter pin driver 33 drives integrally all of the main lifter pins 32 to the up-direction 7, the top portions of the main lifter pins 32 projects from the process level $P_1$ to a higher level $P_3$. The level $P_3$ is known as "a transfer level" at which the substrate W is transferred between the supporting device 60 and the hand AR of the transporter robot RB. Conversely, when the main lifter pin driver 33 drives integrally all of the main lifter pins 32 to the down-direction (-Z), the top portions of the main lifter pins 32 is moved into the through holes 31 to the level under the process level $P_1$, i.e., under the upper surface 12 of the plate 11. Accordingly, the main lifter pins 32 are movable in the vertical direction across the process level $P_1$.

The supporting device 60 further comprises four sub-lifter pins 41 other than the main lifter pins 32 to lift up and down the substrate W. Four through holes 42 are formed through the plate 11 in the vertical direction Z within short-side regions or strips $R_S$ (FIG. 5) of the non-effective area NE. The sub-lifter pins 41 are inserted into the through holes 42 and are connected to a sub-lifter pin driver 43, respectively. When the sub-lifter pin driver 43 is activated, all of the sub-lifter pins 41 move integrally across the process level $P_1$ in the vertical direction, similar to vertical movement the main lifter pins 32. However, the projection length of the sub-lifter pins 41 is different from that of the main lifter pins 32. That is, the projection length $\Delta S$ of the sub-lifter pins 41 is smaller than the projection length $\Delta M$ of the main lifter pins 32. The sub-lifter pins 41 can project up to an intermediate level $P_2$ which is lower than the transfer level $P_3$ but higher than the process level $P_1$.

The combination of the main lifter pins 32 and the sub-lifter pins 41 provides a rectangular arrangement of pins on the plate 11 facing the rectangular frame area of the substrate W, i.e., the non-effective area NE.

On the other hand, the hand AR of the transporter robot RB is movable in the horizontal direction Y and in the vertical direction Z. The substrate W is transferred between the hand AR and the main lifter pins 32 at the transfer level $P_3$ above the sub-lifter pins 41. The substrate W can be transferred without interfering with the sub-lifter pins 41 regardless of the current positions of the sub-lifter pins 41.

Operations

The operations of the supporting device 60 for transferring the substrate W between the plate 11 and the hand AR will be described with reference to FIGS. 6A to 6F.

1. Transfer from Hand AR to Plate 11

Figure 6A:
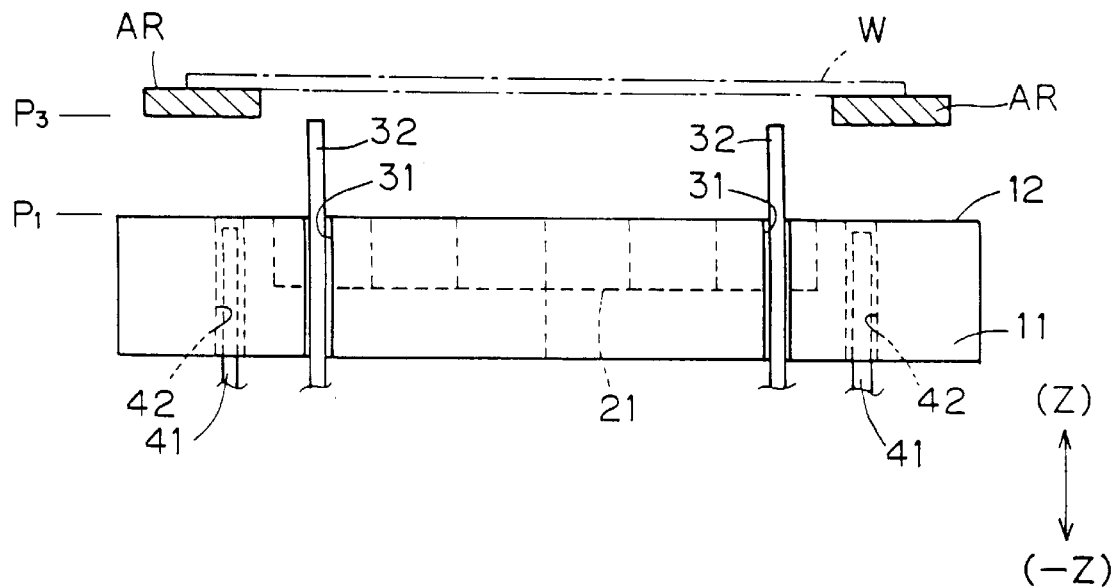
FIGS. 6A to 6F are diagrams illustrating operations of the embodiment of FIG. 3.
Figure 6B:
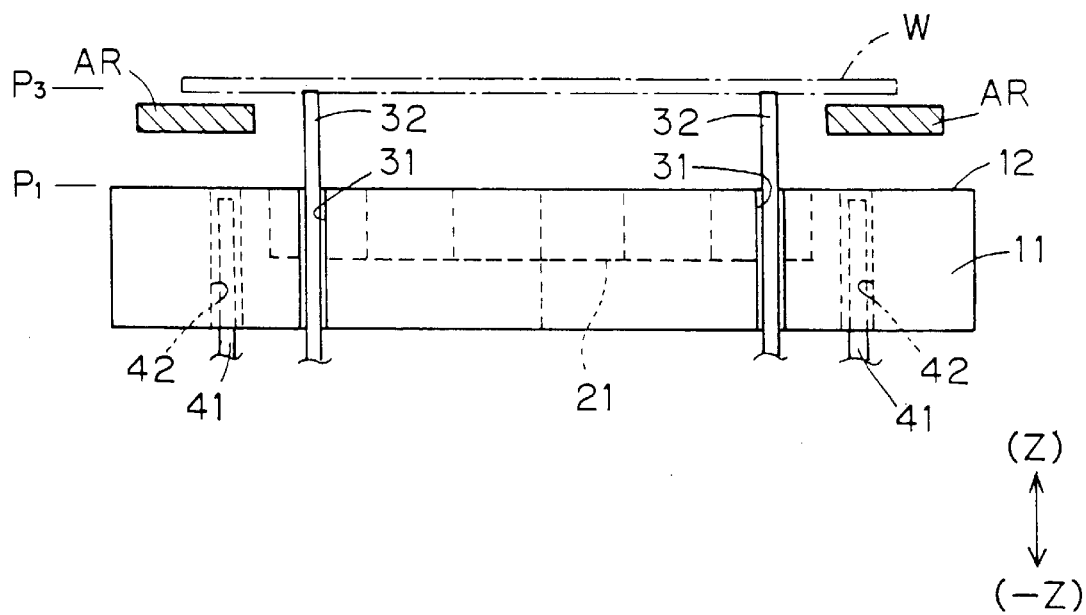
Figure 6C:
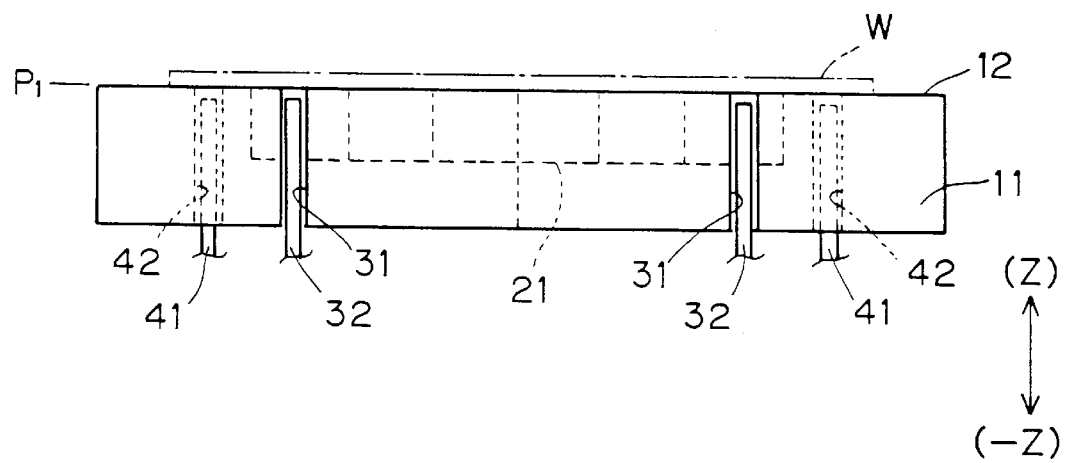

First, in the operation of transferring the substrate W from the hand AR to the plate 11, the main lifter pins 32 are driven to project from the process level $P_1$ by the full projection amount $\Delta M$, so that the top ends of the main lifter pins 32 are at the transfer level $P_3$. The sub-lifter pins 41 are fully retracted in the through holes 42 and are at a level under the process level $P_1$. The vacuum mechanism 22 (FIG. 4) has not as yet been activated. The hand AR holding the substrate W is then moved to a level just above the transfer level $P_3$ (FIG. 6A).

Next, the hand AR goes down below the transfer level $P_3$ (FIG. 6B), so that the substrate W is transferred to and supported by the main lifter pins 32. The hand AR is then withdrawn from the position above the plate 11.

The main lifter pins 32 supporting the substrate W then moves down in the vertical direction (-Z) to a level below the process level $P_1$ (FIG. 6C), whereby the main lifter pins 32 are fully retracted in the through holes 31 and the substrate W is placed on the upper surface 12 of the plate 11 at the process level $P_1$. The vacuum mechanism 22 is activated and the substrate W is tightly contacted with the upper surface 12 of the plate 11. The transfer of the substrate W to the plate 11 is now completed.

2. Transfer from Plate 11 to Hand AR

Figure 6D:
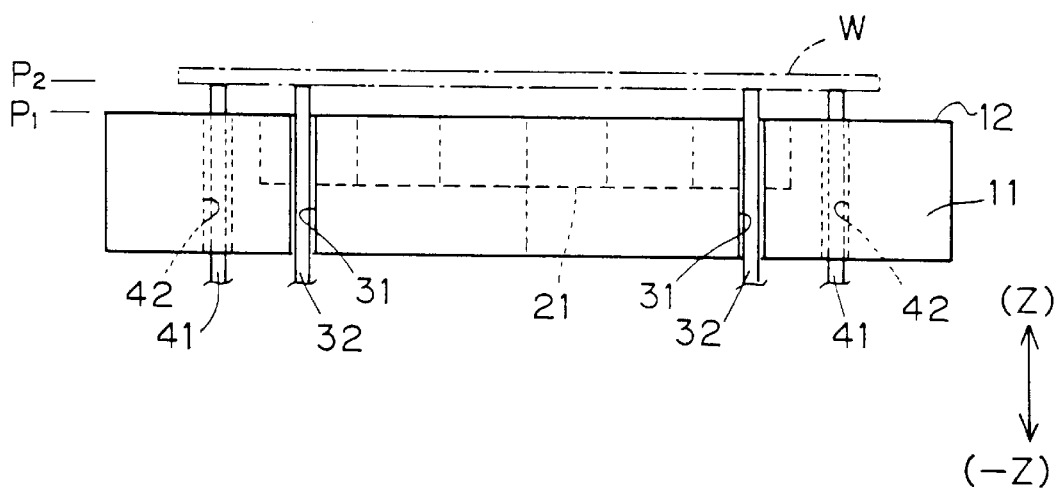

The transferred substrate W is subjected to surface processing by the processing unit 62 (FIG. 2), and then the substrate W is transferred to the hand AR of the robot RB through the following process steps:

The vacuum mechanism 22 is inactivated and the vacuum suction of the substrate W to the upper surface 12 of the plate 11 is released. Then, the main lifter pins 32 and the sub-lifter pins 41 are simultaneously driven to go up in the vertical direction Z. As shown in FIG. 6D, the substrate W is pushed-up to the intermediate level $P_2$ by the pins 32 and 41.

Since not only the main lifter pins 32 but also the sub-lifter pins 41 are used to push-up the substrate W from the upper surface 12 of the plate 11, the substrate W is easily lifted up as compared with the conventional technique in which only main lifter pins are provided. In particular, the multiple arrangement of pins according to the preferred embodiment of the present invention is effective for lifting up the substrate W under which the vacuum suctioning force due to the vacuum mechanism has not fully disappeared. Further, since the longitudinal-side regions $R_L$ and the short-side regions $R_S$ of the non-effective area NE of the substrate W are supported by the main lifter pins 32 and the sub-lifter pins 41, respectively, the substrate W is prevented from being bent by its own weight. This is to be compared with the conventional technique in which only the short-side regions $R_S$ are supported. Respective pins 32 and 41 are arranged to support the non-effective area NE only, whereby the effective area EA is not injured by the pins.

Figure 6E:
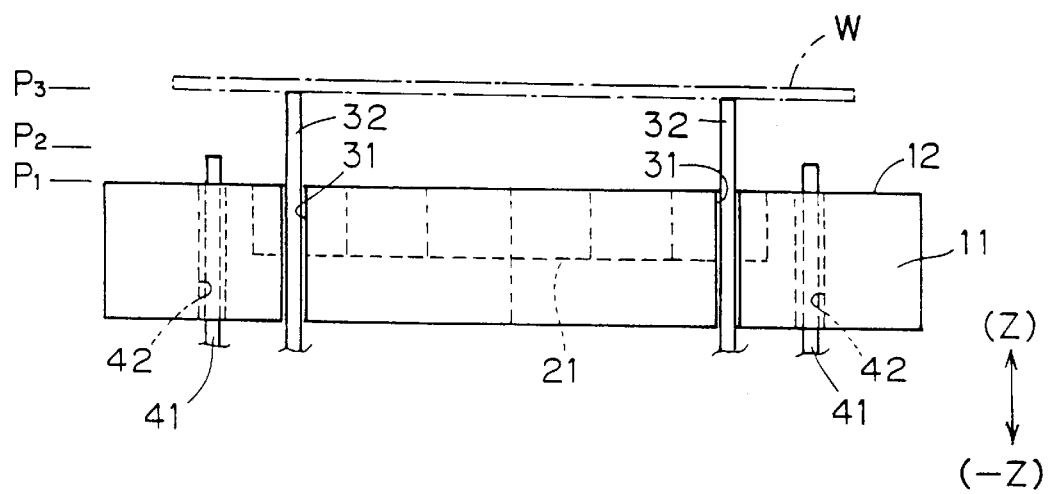
Figure 6F:
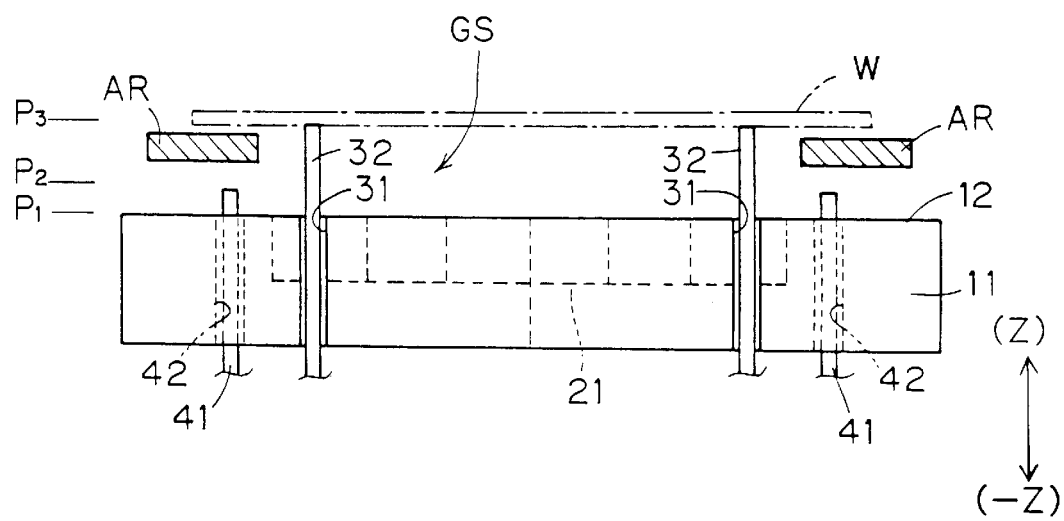

After the substrate W is pushed up to the intermediate level $P_2$, only the main lifter pins 32 further go up to the transfer level $P_3$ in the vertical direction Z (FIG. 6E). The hand AR is introduced into a gap space GS between the transfer level $P_3$ and the intermediate level $P_2$ and is positioned just under the substrate W (FIG. 6F).

The hand AR then moves up in the vertical direction Z across the transfer level $P_3$ to pick up the substrate W (FIG. 6F) from the main lifter pins 32. The sub-lifter pins 41 goes down into the through holes 42 and the initial state is obtained again.

After the transfer of the substrate W to the hand AR, the hand AR removes the substrate W from the apparatus 100 (FIG. 2).

The above-described process steps are repeated for a plurality of substrates, whereby respective substrates are serially processed on the supporting device 60.

Modifications

Although both of the main lifter pins 32 and the sub-lifter pins 41 are used to push up the substrate W in the above-described preferred embodiment (FIG. 6D), only the sub-lifter pins 41 are used to push up the substrate W to the intermediate level $P_2$ as illustrated in FIG. 7. In this modification, the substrate W is supported by the sub-lifter pins 41 in the longitudinal-side regions $R_L$ and bending of the substrate W is prevented as compared with the conventional technique in which only the short-side regions $R_S$ are supported. The hand AR moves above the sub-lifter pins 41 and interference is not caused between the hand AR and the sub-lifter pins 41.

In another modification which is an alternative to the process steps corresponding to FIGS. 6D and 6E, the sub-lifter pins 41 moves up together with the main lifter pins 32 to the transfer level $P_3$ across the intermediate level $P_2$, and then the sub-lifter pins 41 go down to the intermediate level $P_2$ or below the process level $P_1$.

The present invention is also applicable to an apparatus of the type in which the substrate W is processed while supported at a level slightly higher than the top surface 12 of the plate 11.

As has been described, the preferred embodiment of the present invention 25 is constructed such that the sub-lifter pins 41, as well as the main lifter pins 32, are used to push up the substrate W, and the substrate W is easily lifted up. The substrate W is hardly bent and the effective area EA is not injured because the arrangement of the pins are such that the main lifter pins 32 and the sub-lifter pins 41 respecting support the substrate W in the short-side regions $R_S$ and the longitudinal-side regions $R_L$ of the non-effective area NE of the substrate W.

The projection amount of the sub-lifter pins 41 is smaller than that of the main lifter pins 32, so that interference between the hand AR and the sub-lifter pins 41 is prevented.

The hand AR can be inserted into the gap space GS between the transfer level $P_3$ and the intermediate level $P_2$. Accordingly, the hand AR is operable to transfer the substrate W from or to the main lifter pins 32 at the transfer level $P_3$ regardless of the current positions of the sub-lifter pins 41 which are restricted up in their projection up to the intermediate level $P_2$.

Even if vacuum suction is employed to tightly contact the substrate W with the upper surface 12 of the plate 11, the substrate W is easily removed from the upper surface 12 of the plate 11 after the vacuum suction is inactivated.

While the invention has been shown and described in detail, the foregoing description is in all aspects illustrative and not restrictive. It is therefore understood that numerous modifications and variations can be devised without departing from the scope of the invention.

I claim:

1. A device for processing a substrate, comprising:
   a) means for holding said substrate at a first level;
   b) means for processing said substrate held by said holding means at the first level;
   c) first pushing means for pushing up said substrate from said first level to a second level which is above said first level;
   d) a pick-up device to pick-up said substrate; and
   e) second pushing means for pushing up said substrate from said second level to a third level which is above said second level to locate said substrate at a position at which said substrate is capable of being removed from said device by said pick-up device, and an area of said substrate supported by said first pushing means being about the same area of said substrate supported by said pick-up device.

2. The device of claim 1, wherein said first pushing means pushes up a lower surface of said substrate at a predetermined first portion, while said second pushing means pushes up the lower surface of said substrate at a predetermined second portion different from the first portion.

3. The device of claim 2, wherein said first pushing means has a plurality of pins integrally projectable from said first level, and said second pushing means also has a plurality of pins integrally projectable from said second level.

4. The device of claim 3, wherein a projecting length of the plurality of pins of said first pushing means above said first level is smaller than a projecting length of the plurality of pins of said second pushing means above said first level.

5. The device of claim 4, wherein said substrate to be processed has a rectangular major surface having a rectangular effective area which requires processing and a frame area surrounding said rectangular effective area, and wherein a plurality of pins of both of said first and second pushing means are arranged to push up the lower surface of said frame area.

6. The device of claim 5, wherein said major surface of said substrate includes a pair of longer sides and a pair of shorter sides, and wherein the plurality of pins of said first pushing means are arranged to push on the lower surface of said frame area along the pair of said longer sides, while the plurality of pins of said second pushing means are arranged to push on the lower surface of said frame area along the pair of said shorter sides.

7. The device of claim 6, wherein said holding means includes a plate member having an upper surface on which said substrate is placed when supported at the first level, and means for adhering said substrate onto the upper surface of said plate member.

8. The device of claim 2, wherein said substrate to be processed has a rectangular major surface having a rectangular effective area which requires processing and a frame area surrounding said rectangular effective area, and both of said first and second pushing means are arranged to push up a lower surface of said frame area.

9. The device of claim 8, wherein said major surface of said substrate includes a pair of longer sides and a pair of shorter sides, and wherein said first pushing means are arranged to push up the lower surface of said frame area along the pair of said longer sides, while said second pushing means are arranged to push up the lower surface of said frame area along the pair of said shorter sides.

10. The device of claim 2, wherein said holding means includes a plate member having an upper surface on which said substrate is placed when supported at the first level, and means for adhering said substrate onto the upper surface of said plate member.

11. The device of claim 1, wherein said first pushing means has a plurality of pins simultaneously projectable from said first level, and said second pushing means also has a plurality of pins simultaneously projectable from said second level.

12. The device of claim 1, wherein said substrate to le processed has a rectangular major surface having a rectangular effective area which requires processing and a frame area surrounding said rectangular effective area, and both of said first and second pushing means are arranged to push up the lower surface of said frame area.

13. The device of claim 12, wherein said major surface of said substrate includes a pair of longer sides and a pair of shorter sides, and wherein said first pushing means are arranged to push up the lower surface of said frame area along the pair of said longer sides, while said second pushing means are arranged to push up the lower surface of said frame area along the pair of said shorter sides.

14. The device of claim 1, wherein said holding means includes a plate member having an upper surface on which said substrate is placed when supported at the first level, and means for adhering said substrate onto the upper surface of said plate member.

15. A method of removing a substrate processed in a processing device for processing said substrate supported at a first level, comprising the steps of:
   a) pushing up said substrate processed by said processing device from said first level to a second level above said first level by a first pushing means;
   b) further pushing up said substrate from said second level to a third level above said second level by a second pushing means different from said first pushing means;
   c) inserting, under said third level, a pick-up device to pick-up said substrate; and
   d) lifting up said robot hand to pick up said substrate supported at said third level by said second pushing means, with an area of said substrate supported by said first pushing means being about the same area of said substrate supported by said robot hand.

16. The method of claim 15, wherein said substrate to be processed has a rectangular major surface having a rectangular effective area which requires processing and a frame area surrounding said rectangular effective area, and both of said first and second pushing means are arranged to push up a lower surface of said frame area.

17. The method of claim 16, wherein said major surface of said substrate includes a pair of longer sides and a pair of shorter sides, said substrate is pushed up by said first pushing means by pushing up a first portion in the lower surface of said frame area along the pair of said longer sides, and wherein said substrate is pushed up by said second pushing means by pushing up a second portion in the lower surface of said frame area along the pair of said shorter sides, said first portion being different from said second portion.

18. The method of claim 15, wherein said substrate is supported by a plate member with said substrate tightly contacting an upper surface of said plate member, said second level is attained by said substrate so as to remove said substrate from said plate member, and said third level is attained by said substrate so as to permit said pick-up device to be inserted under said substrate supported at the third level.

19. A device for processing a substrate, comprising:
   a) a substrate support for holding said substrate at a first level;
   b) a processing unit for processing said substrate held by said substrate holder at the first level;
   c) a first pin mechanism for pushing up said substrate from said first level to a second level above said first level;
   d) a pick-up device to pick-up said substrate; and
   e) a second pin mechanism for pushing up said substrate from said second level to a third level above said second level to locate said substrate at a position at which said substrate is capable of being removed from said device by said pick-up device, and an area of said substrate supported by said first pin mechanism being about the same area of said substrate supported by said pick-up device.

20. The device of claim 19, wherein said first pin mechanism includes a first plurality of pins and a sub-lifter pin drive for raising said first plurality of pins from said first level to said second level.

21. The device of claim 20, wherein said second pin mechanism includes second plurality of pins and a main lifter pin drive for raising said second plurality of pins from said second level to said third level.

22. The device of claim 19, wherein said first pin mechanism pushes up on a lower surface of said substrate a predetermined first portion thereof, while said second pin mechanism pushes up on the lower surface of said substrate a predetermined second portion of said lower surface which is different from the first portion.

23. The device of claim 22, wherein said first pin mechanism has a plurality of pins simultaneously projectable from said first level, and said second pin mechanism also has a plurality of pins simultaneously projectable from said second level.

24. The device of claim 23, wherein a projection length of the plurality of pins of said first pushing mechanism above said first level is smaller than a projection length of the plurality of pins of said second pin mechanism above said first level.

25. The device of claim 24, wherein said substrate to be processed has a rectangular major surface having a rectangular effective area which requires processing and a frame area surrounding said rectangular effective area, and wherein the plurality of pins of both of said first and second pin mechanism are arranged to push up the lower surface of said frame area.

26. The device of claim 25, wherein said major surface of said substrate includes a pair of longer sides and a pair of shorter sides, and wherein the plurality of pins of said first pin mechanism are arranged to push up on the lower surface of said frame area along the pair of said longer sides, while the plurality of pins of said second pin mechanism are arranged to push up on the lower surface of said frame area along the pair of said shorter sides.

27. The device of claim 26 wherein said substrate support includes a plate member having an upper surface on which said substrate is placed when supported at the first level, and a suction mechanism for adhering said substrate onto the upper surface of said plate member.

28. The device of claim 19, wherein said substrate to be processed has a rectangular major surface having a rectangular effective area which requires processing and a frame area surrounding said rectangular effective area, and both of said first and second pin mechanisms are arranged to push up on a lower surface of said frame area.

29. The device of claim 19, wherein said first pin mechanism and said second pin mechanism together lift up the substrate from said first level to said second level.

* * * * *